United States Patent
Kunc et al.

(10) Patent No.: US 7,635,995 B2
(45) Date of Patent: Dec. 22, 2009

(54) VOLTAGE COMPARATOR

(76) Inventors: Vinko Kunc, Gerbičeva 50, Ljubljana (SI) 1000; Andrej Vodopivec, Sojerjeva 63, Ljubljana (SI) 1000

( * ) Notice: Subject to any disclaimer, the term of this patent is extended or adjusted under 35 U.S.C. 154(b) by 1 day.

(21) Appl. No.: 11/667,405

(22) PCT Filed: Nov. 9, 2005

(86) PCT No.: PCT/SI2005/000033

§ 371 (c)(1),
(2), (4) Date: Dec. 3, 2007

(87) PCT Pub. No.: WO2006/052225

PCT Pub. Date: May 18, 2006

(65) Prior Publication Data

US 2008/0204083 A1    Aug. 28, 2008

(30) Foreign Application Priority Data

Nov. 10, 2004    (SI)    ................ 200400306

(51) Int. Cl.
*H03K 5/22* (2006.01)
(52) U.S. Cl. ............... 327/65; 327/66; 327/309
(58) Field of Classification Search ................ 327/63, 327/65–67, 309, 313, 563; 330/253, 257
See application file for complete search history.

(56) References Cited

U.S. PATENT DOCUMENTS

| 6,172,535 | B1 * | 1/2001 | Hopkins | .................. 327/66 |
| 6,252,437 | B1 | 6/2001 | Fischer et al. | |
| 6,292,030 | B1 | 9/2001 | Shih | |
| 6,392,449 | B1 | 5/2002 | Taft | |
| 6,445,218 | B1 * | 9/2002 | Lee | .................. 327/65 |

FOREIGN PATENT DOCUMENTS

| EP | 1 355 427 A1 | 10/2003 |
| WO | WO 2006/005225 A1 | 5/2006 |

* cited by examiner

*Primary Examiner*—Long Nguyen
(74) *Attorney, Agent, or Firm*—Jacobson Holman PLLC

(57) ABSTRACT

A voltage comparator where the difference of currents from transistors is converted into voltage, which is amplified and conducted to a gate terminal of a switching transistor. A source of a limiting transistor is connected to the gate terminal. The voltage at the gate terminal when the switching transistor is quiescent is equal to a value between eight and nine tenths of the switching voltage at the gate of the transistor, at which voltage the transistor triggers a switching in the output stage. A response to an input voltage change at one direction of the sign reversal of the difference of the input voltages is fast. The voltage comparator is robust and reliable with regard to temperature variations.

8 Claims, 3 Drawing Sheets

VOLTAGE COMPARATOR

This is a national stage of PCT/SI05/000033 filed Nov. 9, 2005 and published in English.

BACKGROUND AND SUMMARY OF THE INVENTION

The invention concerns a comparator of voltages, in which input currents of input transistors, whereto said voltages are conducted, are subtracted one from another and the current difference is converted into a voltage, which is amplified and conducted to a gate terminal of a switching transistor at an input of an output stage of the voltage comparator, whereat the voltage comparator of the invention has an especially fast response to an input voltage change at one direction of a sign reversal of the difference of the input voltages.

The invention solves the technical problem how to improve the voltage comparator circuit as described at the beginning in order to have a fast response to an input voltage change at one direction of a sign reversal of the difference of the input voltages.

Each conversion of an electric signal from the analogous representation into the digital one begins by comparing a signal voltage to individual quantized voltage levels.

A voltage comparator compares which one of the voltages at its two input terminals is higher and, depending on the result of the comparison, produces a potential of a high or low supply voltage at its output terminal.

Most voltage comparators are composed of an input stage, which compares both input voltages, an amplification stage, which amplifies the small voltage difference of usually current signals entering it, and an output stage, which generates a digitally represented output signal.

The voltage comparator must have an exactly determined position of the switch point and a sufficiently high switching rate. The rate of an individual switching is essentially determined by the time period needed by the voltage comparator after the moment of the sign reversal at the difference of the input voltages to change the logical state at its output.

A new value of the potential at the output terminal of the voltage comparator is generated as a result of voltage changes at its internal terminals, however, these voltage changes and the resulting generation of the potential at the output terminal of the voltage comparator are delayed because of parasitic capacitances and resistances in the voltage comparator circuit.

It is often important to the operation of a complex circuit that the voltage comparator assigned thereto responds rapidly to an input voltage change at only one direction of the sign reversal of the difference of the input voltages. For example, the voltage comparator must accurately detect a passage of only an increasing signal through the reference value, whereas the response rate of the voltage comparator at a decreasing signal is not important.

When a high switching rate is needed, generally a technology providing a faster response can be chosen. The technology is usually determined by requirements with respect to other circuits on the same substrate, however, the choice is also influenced by the price.

A faster rate within an available technology is reached by increasing the density of the operating electric current in the voltage comparator. Thereby the voltage changes at the elements having parasitic capacitances are reached faster. However, the current-carrying capacity of the elements at a specified supply voltage is limited. Additionally, a high consumption of electric current is not allowed in some applications.

Further, a voltage comparator is known, which besides a basic input stage provided to generate output electric currents, which are subtracted one from another, also comprises an auxiliary input stage, to the inputs whereof also the compared voltages are conducted and which through current mirrors supplies an additional electric current to the main junction of the amplification stage (U.S. Pat. No. 6,172,535). In fact, the parasitic capacitors are loaded faster, yet the current consumption of the circuit is substantially higher.

A regenerative circuit provided with an operating point presetting is often used. The voltage comparator comprises a positive feedback loop, which is usually made as a cross-connection in the amplification stage: between elements 34, 36 and 38, 40 in the circuit of U.S. Pat. No. 6,292,030 and between elements M3A and M3B in the circuit of U.S. Pat. No. 6,392,449. As soon as the voltage in the amplification stage begins to change, the cross-connection reinforces this changing and the switching is considerably accelerated, wherefor no higher electric current is needed. To ensure that after the switching the positive feedback loop would not retain the voltage comparator in the new state, which would mean that a new sign reversal of the difference of the input voltages could not change the state of the input signal, the voltage comparator is provided with a resetting circuit (transistor 42 and M4, respectively), which opens the positive feedback loop and sets the circuit back into the state of symmetry. However, the positive feedback loop immediately pushes the circuit into either output signal state depending on the state at the voltage comparator input as soon as the resetting signal is removed, e.g. at the moments when the comparison is to be carried out, for example in an analogue-to-digital converter.

The said technical problem is solved by the voltage comparator of the invention as characterized by the features of the characterizing portion of the first claim, and the variants of the embodiment are characterized by dependent claims.

The voltage comparator of the invention is distinguished in that by means of a proposed limiter of the operating voltage displacement an especially fast response to an input voltage change is achieved at one direction of the sign reversal of the difference of the input voltages. It is robust and reliable irrespective of temperature changes and changes in the technological layout.

BRIEF DESCRIPTION OF THE DRAWINGS

The invention will now be explained in more detail by way of the description of an embodiment and with reference to the accompanying drawing representing in.

DETAILED DESCRIPTION OF THE PREFERRED EMBODIMENTS

Figure 1:
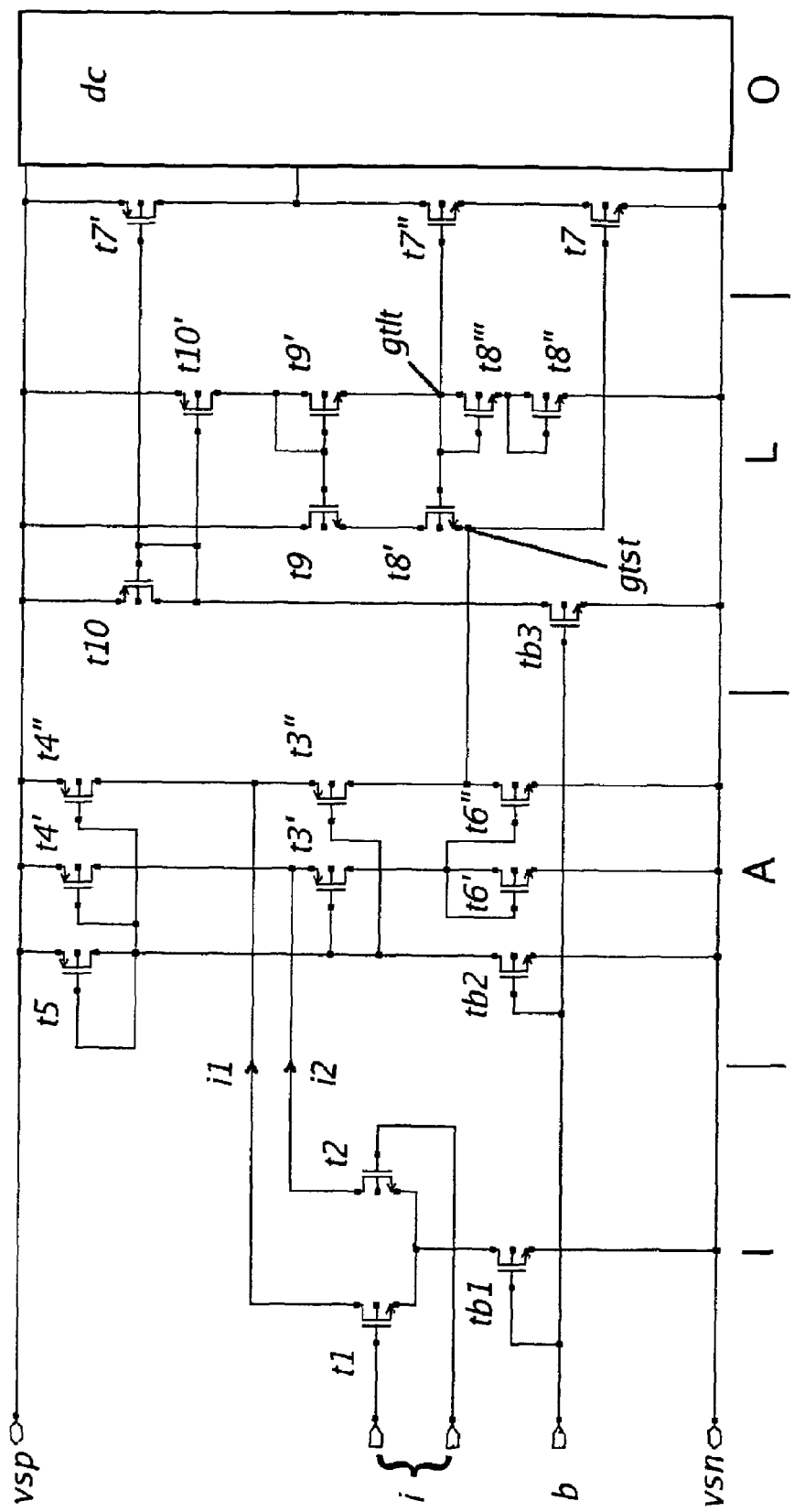
FIG. 1 is a voltage comparator circuit of the invention.

A voltage comparator composed of an input stage I, an amplification stage A and an output stage O is improved according to the invention in that between the last two stages a proposed operating-voltage swing limiter L is connected (FIG. 1).

The potentials of the compared voltages are conducted to input terminals i of the input circuit I and from there to gates of a first transistor t1 and a second transistor t2, which are differentially connected and to which the current is supplied by a transistor tb1 connected to an input terminal b for a reference voltage. The voltage comparator circuit is provided with a terminal vsp of a high supply voltage and a terminal vsn of a low supply voltage.

The output currents I1 and I2 from the first transistor t1 and the second transistor t2, respectively, are subtracted from each other in the amplification stage A. The current difference is converted into a voltage, which is amplified. The amplification stage A is provided with a first current source composed of transistors t3' and t4' and a second current source composed of transistors t3" and t4". Currents I1 and I2 flow to the first and the second current source, respectively, which are controlled by a transistor t5 fed by a current from a transistor tb2 and which are mapped to currents from said current sources. The transistors t6' and t6" convert the difference of the currents from said current sources into an output voltage of the amplification stage A. The gain is above 50-fold with respect to the voltage difference $\Delta Vi$ at the input terminals i of the voltage comparator.

The output voltage of the amplification stage A is conducted to a gate terminal gtst of a switching transistor t7 at the input of an output stage O of the voltage comparator of the invention. Hence, the transistors t6' and t6" set the operation point for the gate of the switching transistor t7. Actually, in the point gtst the currents from the first and second source are subtracted from each other. However, since this point is the voltage control terminal of the switching transistor t7, it operates as a voltage output of the amplification stage A, which sets itself in an appropriate voltage state depending on the sign of the difference of said electric currents.

The source of a limiting transistor t8' in the intermediate operating-voltage swing limiter stage L, which is proposed by the invention to be inserted between the amplification stage A and the output stage O and functions as a limiter L of the displacement of the operating point of the voltage comparator of the invention, is connected to the gate terminal gtst of the switching transistor t7. The limiting transistor t8' limits the voltage displacement in the point gtst.

A gate terminal gtlt of the limiting transistor t8' is connected to the terminal of the low supply voltage through two series-connected and diode-connected—the gate connected to the drain—third and fourth transistor t8", t8'". The potential of the terminal gtlt exceeds the potential of the low supply voltage terminal for the sum of a double threshold voltage of a transistor of the same type as the transistors t8", t8'" and of the voltage drop needed by said transistors t8", t8'" to drain the current generated by a transistor t10'. Said voltage drop is set by the selection of the geometry of the transistors.

Namely, in the point gtst the transistors t8", t8'" generate the voltage, which is close to a double switching voltage of the switching transistor t7. The limiting transistor t8' opens when the voltage difference between the point gtst and the point gtlt exceeds its threshold voltage. Therefore the limiting transistor t8' stops any further decrease of the voltage in the point gtst when it starts to supply electric current. Hence the voltage comparator of the invention expects the sign reversal of the difference of the input voltages, to which sign reversal it must respond quickly, in a state just below the switching voltage Vsw of the output stage O.

It is decisive for the switching rate of the voltage comparator of the invention how fast the switching voltage Vsw is set up at the point gtst. Moreover, Vsw is the voltage at the gate of the switching transistor t7, at which this transistor triggers the switching in the output stage O.

The operating-voltage swing limiter stage L must be made so that the transistors t8", t8'", which are series-connected behind each other and diode-connected, are fed by a similar current as the switching transistor t7. To this end, the transistor t10', which is the current source for the transistors t8", t8'", series-connected behind each other and diode-connected, and a transistor t7', which is the current source for the switching transistor t7, are controlled by the same transistor t10; the transistors t7 and t7' are connected through a transistor t7".

The voltage at the gate terminal gtst of the switching transistor t7 is set by the transistor t10' as the current source and by the selection of the geometry of transistors t8", t8'" in such a way that it is slightly below the switch point of the switching transistor t7 when it is quiescent, in other words, it is equal to a value between 0.8 Vsw and 0.9 Vsw. Therefore the output stage O, which is provided with a digitizing circuit dc, is laid out so that its switching point depends mainly on the threshold voltage of the switching transistor t7.

Figure 2:
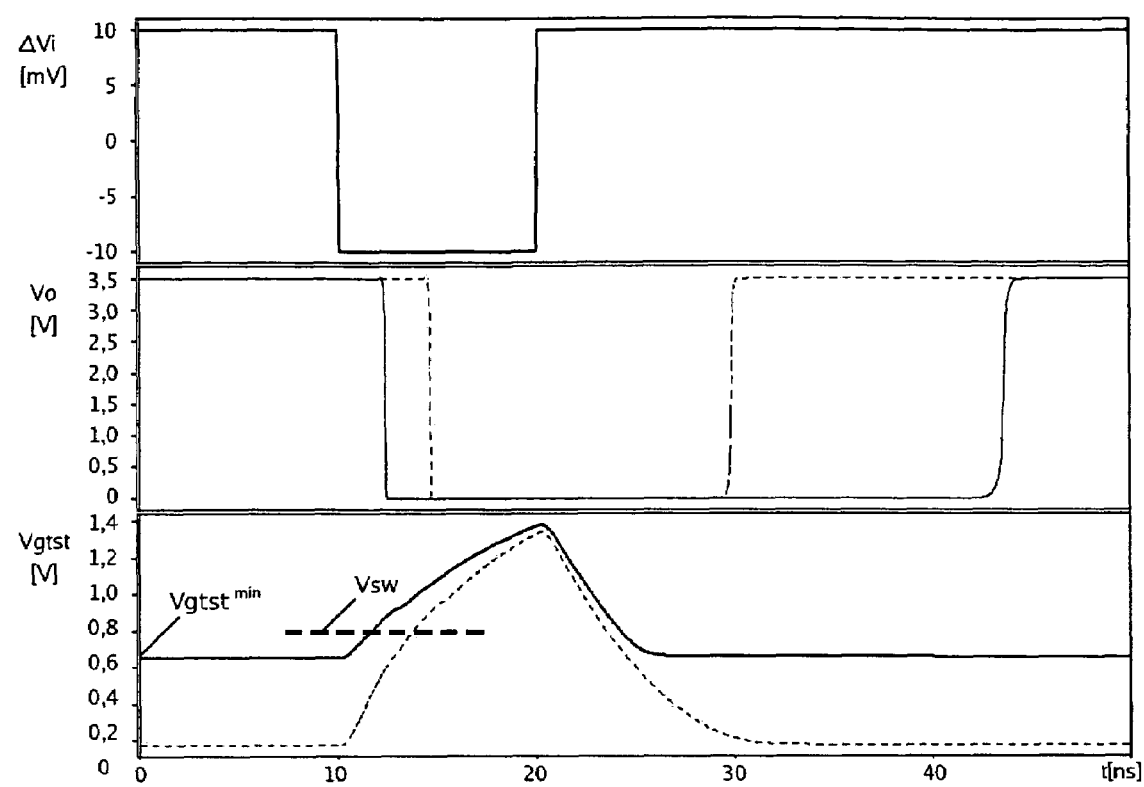
FIG. 2 is a graph representing the time dependence of a difference ΔVi of voltages at the inputs of the voltage comparator, a graph representing the time dependence of a voltage Vo at the output of voltage comparators according to the state of the art and of the invention and a graph representing the time dependence of a voltage Vgtst at a gate terminal of a switching transistor at the input of an output stage according to the state of the art and of the invention.

In the windows 1 and 2 of FIG. 2 there are shown a graph representing the time dependence of the difference $\Delta Vi$ of voltages at the inputs i of the voltage comparator and a graph representing the time dependence of the voltage Vo at the output of the voltage comparator according to the state of the art (dashed) and of the invention, respectively, whereas in the window 3 a graph representing the time dependence of the voltage Vgtst at a gate terminal of a switching transistor at the input of the output stage according to the state of the art (dashed) and of the invention are represented. According to the invention the voltage Vgtst drops only to the value $Vgtst^{min}$, which is not far below the switching voltage Vsw, whereas according to the state of the art each time it starts to increase practically from zero. The difference between the switching voltage Vsw and the lowest value of the voltage Vgtst, however, is important for the switching rate. At the same compensation current supplied to the point gtst through the limiting transistor t8' the switching according to the invention is faster.

The switching delay of the voltage comparator of the invention amounts to only 2 ns 1 ns being due to the output stage O, whereas the switching delay of the voltage comparator without the proposed limitter L amounts to 4 ns, 1 ns again being due to the output stage O.

The switching transistor t7, the limiting transistor t8' and the third and fourth transistor t8", t8'", series-connected behind each other and diode-connected, are transistors of the same type and with a similar geometry. Since also the current conditions in said transistors are similar, the voltage at the point gtst follows the switching point of the switching transistor t7 at temperature variations as well at various technological layouts of the voltage comparator of the invention. The voltage comparator of the invention is robust and reliable.

Figure 1A:
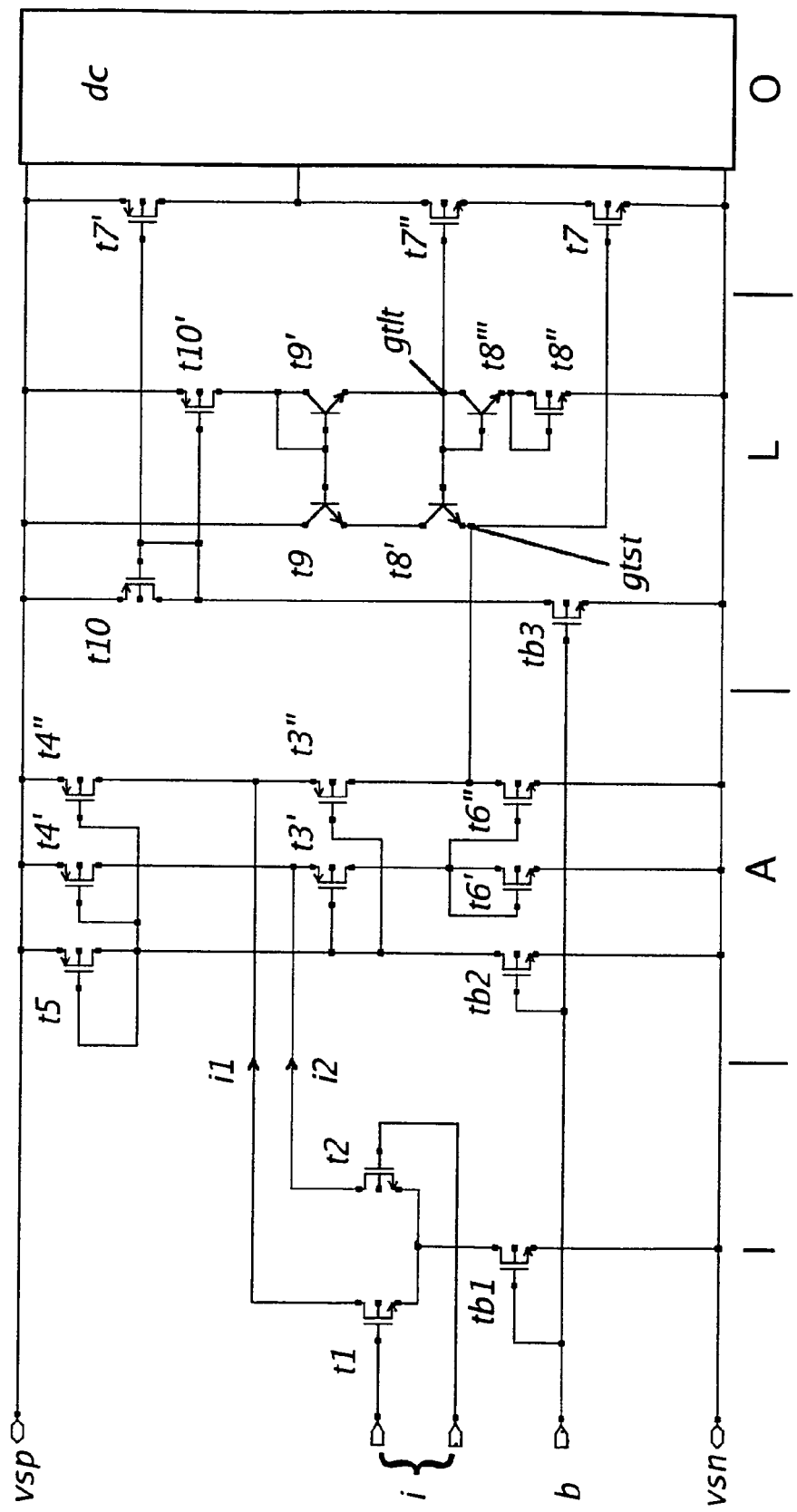
FIG. 1a is a variant embodiment of a voltage comparator circuit of the invention.

The limiting transistor t8', the fourth transistor t8'" and the cascode transistor t9 are transistors of the NMOS type, PMOS type or bipolar transistors (FIG. 1a), the switching transistor t7 and the third transistor t8", however, are transistors of the NMOS type or PMOS type.

The voltage at the drain of the limiting transistor t8' is advantageously stabilized by the cascode transistor t9, which is connected thereto and whose drain is connected to the terminal vsp of the high supply voltage. The cascode transistor t9 must be of the same type and have a similar geometry as the limiting transistor t8'. The voltage at the gate (at the base in the case of a bipolar transistor) of the cascode transistor t9, however, must differ from the voltage at the point gtlt for the voltage needed for the operation of the limiting transistor t8', hence, for 200 mV to 1 V. It is generated by a resistor or the diode-connected transistor t9', which is connected in series to the transistors t8", t8''' in the point gtlt.

The described stabilization of the voltage at the drain of the limiting transistor t8' is useful when a considerable oscillation of the supply voltage is expected. However, it is also applied when the limiting transistor t8' has a short channel and, because of the channel modulation, the limiting voltage would follow the oscillation of the supply voltage.

The invention claimed is:

1. A voltage comparator, whose input terminals (i) for two compared voltages are connected to gates of a first and a second transistor (t1, t2), which are differentially connected and whose output currents are subtracted from each other to obtain a current difference and the said current difference is converted into voltage, which is amplified and conducted to a gate terminal (gtst) of a switching transistor (t7) at an input of an output stage (O), which is provided with a digitizing circuit (dc), characterized in that a source of a limiting transistor (t8'), whose gate is connected to a terminal (vsn) of a low supply voltage through third and fourth transistors (t8", t8'''), series-connected behind each other and diode-connected, is connected to the gate terminal (gtst) of the switching transistor (t7), that the voltage at the gate terminal (gtst) of the switching transistor (t7) when the switching transistor is quiescent is equal to a value between eight and nine tenths of a switching voltage (Vsw) at the gate of the switching transistor (t7), at which voltage the switching transistor t(7) triggers a switching in the output stage (O), that the third and fourth transistors (t8", t8'''), series-connected behind each other and diode-connected, are supplied by a similar current as the switching transistor (t7) and that the switching transistor (t7), the limiting transistor (t8') and the third and fourth transistors (t8", t8'''), series-connected behind each other and diode-connected, are transistors of the same type.

2. Voltage comparator as recited in claim 1, characterized in that the switching transistor (t7), the limiting transistor (t8') and the third and fourth transistors (t8", t8''') are transistors having a similar geometry.

3. Voltage comparator as recited in claim 2, characterized in that the limiting transistor (t8') operates in similar current conditions as the switching transistor (t7) and the third and fourth transistors (t8", t8''').

4. Voltage comparator as recited in claim 3, characterized in that a drain of the limiting transistor (t8') is connected to a terminal (vsp) of a high supply voltage through a cascode transistor (t9).

5. Voltage comparator as recited in claim 4, characterized in that the cascode transistor (t9) is of the same type and has a similar geometry as the limiting transistor (t8').

6. Voltage comparator as recited in claim 5, characterized in that the switching transistor (t7), the limiting transistor (t8'), the third and fourth transistors (t8", t8''') and the cascode transistor (t9) are transistors of the NMOS type.

7. Voltage comparator as recited in claim 5, characterized in that the switching transistor (t7), the limiting transistor (t8'), the third and fourth transistors (t8', t8''') and the cascode transistor (t9) are transistors of the PMOS type.

8. Voltage comparator as recited in claim 5, characterized in that the limiting transistor (t8'), the fourth transistor (t8") and the cascode transistor (t9) are transistors of the bipolar type.

* * * * *